United States Patent
Bains et al.

(10) Patent No.: US 8,281,101 B2
(45) Date of Patent: Oct. 2, 2012

(54) DYNAMIC RANDOM ACCESS MEMORY WITH SHADOW WRITES

(75) Inventors: Kuljit S. Bains, Olympia, WA (US); Randy B. Osborne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 822 days.

(21) Appl. No.: 12/344,518

(22) Filed: Dec. 27, 2008

(65) Prior Publication Data

US 2010/0165780 A1    Jul. 1, 2010

(51) Int. Cl.
*G06F 13/00* (2006.01)
*G11C 7/10* (2006.01)
(52) U.S. Cl. .... 711/167; 711/154; 711/168; 365/189.04
(58) Field of Classification Search .................. None
See application file for complete search history.

(56) References Cited

U.S. PATENT DOCUMENTS

| | | | | |
|---|---|---|---|---|
| 6,351,427 | B1 * | 2/2002 | Brown | 365/230.03 |
| 7,340,577 | B1 | 3/2008 | Van Dyke et al. | |
| 7,447,805 | B2 * | 11/2008 | Braun et al. | 710/5 |
| 7,916,554 | B2 * | 3/2011 | Pawlowski | 365/189.04 |
| 2002/0046331 | A1 * | 4/2002 | Davis et al. | 711/167 |
| 2004/0252577 | A1 * | 12/2004 | Kwak et al. | 365/232 |
| 2006/0179213 | A1 * | 8/2006 | Brittain et al. | 711/105 |
| 2007/0005868 | A1 | 1/2007 | Osborne | |
| 2007/0242532 | A1 * | 10/2007 | Barth et al. | 365/189.05 |
| 2007/0253262 | A1 * | 11/2007 | Oh et al. | 365/193 |
| 2008/0040529 | A1 * | 2/2008 | Bartley et al. | 710/307 |
| 2008/0114947 | A1 * | 5/2008 | Brox et al. | 711/154 |

OTHER PUBLICATIONS

Office Action for Application No. 0921976.7 dated Jun. 23, 2010, 5 pages.

* cited by examiner

*Primary Examiner* — Kaushikkumar Patel
(74) *Attorney, Agent, or Firm* — Blakely, Sokoloff, Taylor & Zafman LLP

(57) ABSTRACT

Methods and apparatus are disclosed for reducing write-to-read turnaround times using shadow writes in memory controllers and in DRAM. Embodiments of controllers including shadow write control logic may, in response to receiving a write request, issue an external write column address strobe (CAS) to DRAM to latch a valid write CAS address, and assert a set of write data values to be stored in a set of DRAM locations corresponding to the write CAS address. After asserting the write CAS and prior to asserting the complete set of write data values, such memory controllers may, in response to receiving a read request, issue an external read CAS to DRAM to indicate a valid read CAS address. A set of read data values from a second set of DRAM locations corresponding to the read CAS address, are received with reduced turnaround time after asserting the complete set of write data values.

16 Claims, 7 Drawing Sheets

DYNAMIC RANDOM ACCESS MEMORY WITH SHADOW WRITES

FIELD OF THE DISCLOSURE

This disclosure relates generally to the field of computing. In particular, the disclosure relates to techniques to reduce write-to-read or read-to-write turnaround times using shadow writes or reads in memory controllers and dynamic random access memory.

BACKGROUND OF THE DISCLOSURE

Dynamic random access memory (DRAM) is a type of volatile random access memory used in modern computing systems. DRAM technology advantages include higher density and lower cost, since a storage cell requires only one transistor and a capacitor per bit of storage. Static or non-volatile memories, on the other hand, require more devices.

Double-data-rate (DDR) memory is a kind of synchronous DRAM, which responds to control inputs on specific edges of the clock and is therefore synchronized with the computer's system bus. DDR memory can transfer data on the rising and the falling edges of a clock—referred to as double-pumping. One benefit of DDR memory is the ability to transfer data at eight times the data rate of the DRAM memory cells it contains, thus enabling higher bus rates and higher peak rates than earlier memory technologies. However, there is no corresponding reduction in latency, which may be proportionally higher.

For example, in third generation DDR memory (DDR3) a read column address strobe (CAS) may be issued to the DRAM only after a write-to-read period (tWTR) following the completion of a write transfer from the memory controller on an external bus. Then the memory controller must wait for a CAS latency period (tCL) to receive the read data transfer from the DRAM on the external bus. During this turnaround time period (tWTR+tCL) between the end of a writing data and the beginning of reading data on the external bus/interface, internal DRAM write and read transfers are taking place on an internal DRAM bus. Thus the memory controller must wait for the duration of this turnaround time period for a read data transfer, the duration of which may be critical to system performance.

In order to reduce the turnaround time, internal busses and/or data buffers may be replicated so as to eliminate internal conflicts, but such replications result in increases in area and in cost, which in turn, reduce some of the primary advantages of using DRAM technology (i.e. higher density and lower cost).

To date, more efficient techniques for reducing such turnaround time periods have not been fully explored.

BRIEF DESCRIPTION OF THE DRAWINGS

The present invention is illustrated by way of example and not limitation in the figures of the accompanying drawings.

DETAILED DESCRIPTION

Methods and apparatus are disclosed for reducing write-to-read turnaround times using shadow writes in memory controllers and dynamic random access memory (DRAM). Some embodiments of memory controllers including shadow write control logic may, in response to receiving a processor write request, issue an external write column address strobe (CAS) to DRAM to latch a valid write CAS address, and assert a set of write data values to be stored in a set of DRAM locations corresponding to the write CAS address. After asserting the external write CAS and prior to asserting the complete set of write data values, such memory controllers may, in response to receiving a processor read request, issue an external read CAS to DRAM to indicate a valid read CAS address. A set of read data values from a second set of DRAM locations corresponding to the read CAS address, are received within a reduced turnaround time after asserting the complete set of write data values.

Through use of the methods and apparatus herein disclosed, the duration of the turnaround time period that the memory controller must wait for a read data transfer are reduced, which may be critical to overall system performance. Thus, such methods and apparatus may be employed to reduce write-to-read turnaround times and improve performance-sensitive read operations from DRAM (e.g. especially in double-data-rate four (DDR4) or higher DRAM systems).

It will be appreciated that while the description herein disclosed gives specific examples in terms of improving write-to-read turnaround times, the invention is not so limited. Similar improvements may be realized in read-to-write turnaround times, but the duration of the turnaround time period that the memory controller must wait for a write data transfer may not be quite as critical to the overall system performance.

In the following description, numerous specific details are set forth. However, it is understood that embodiments of the invention may be practiced without these specific details. In other instances, well-known circuits, structures and techniques have not been shown in detail in order not to obscure the understanding of this description. These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than a restrictive sense and the invention measured only in terms of the claims and their equivalents.

Figure 1:
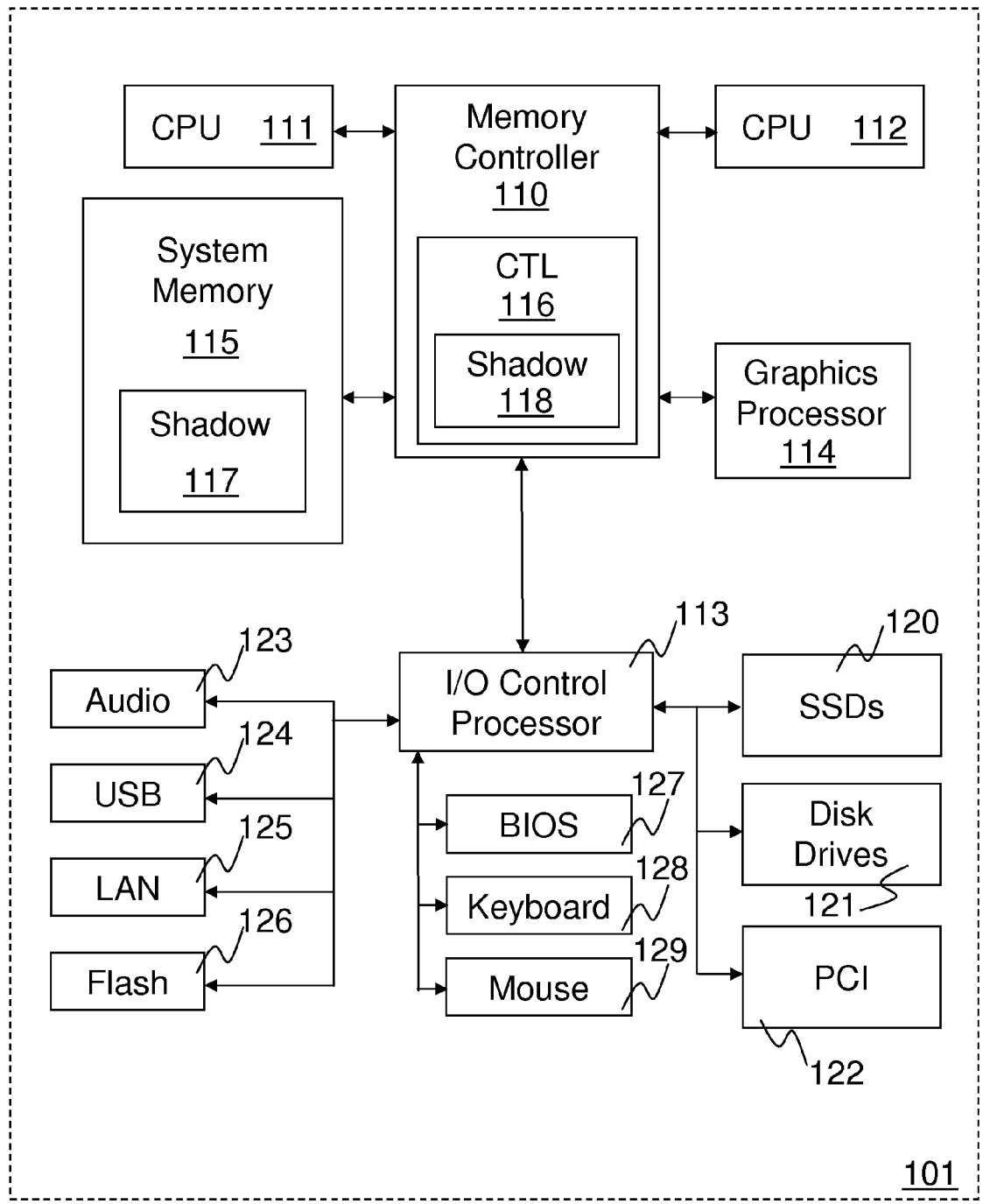
FIG. 1 illustrates one embodiment of a computing system using shadow writes in a memory controller and in a dynamic random access memory (DRAM).

FIG. 1 illustrates one embodiment of a computing system 101 using shadow writes in a memory controller and in a dynamic random access memory (DRAM). Computing system 101 includes system memory 115, central processors, CPU 111 and CPU 112, and memory controller 110. Computing system 101 also includes an I/O control processor 113, I/O devices such as audio 123, universal serial bus (USB) 124, local area network (LAN) 125, keyboard 128, mouse 129; graphics processor 114 and may also include DMA (direct memory access) processors. In addition computing system 101 includes certain storage devices, such as flash memory storage 126, BIOS 127, solid state drives (SSDs) 120, disk drives 121, PCI (Peripheral Component Interconnect) and/or PCI-E (PCI Express) devices 122.

Central processors, CPU 111 and CPU 112, can issue write requests and read requests corresponding to storage locations in system memory 115.

Memory controller 110 includes control logic 116 for accessing system memory 115, graphics processor 114, and I/O control processor 113. Control logic 116 includes standard DRAM control logic and also includes shadow control logic 118. Control logic 116 and/or shadow control logic 118 of memory controller 110, are responsive to receiving processor write requests and issue external write column address strobe (CAS) signals to the various DRAM modules of system memory 115 to latch valid write CAS addresses for accessing the DRAM of system memory 115. Memory controller 110 asserts a set of write data values to be stored in DRAM locations of system memory 115 corresponding to the write CAS address.

Some embodiments of system memory 115 include double-data-rate (DDR) DRAM modules and the set of write data values may comprise eight bytes of data that are serially transmitted in four external clock cycles (i.e. double pumped). Embodiments of DRAM modules of system memory 115 include DRAM locations that may be organized into banks of DRAM locations, the banks optionally being further organized into bank groups. Shadow write control logic 117 in DRAM modules of system memory 115, upon receiving the external write CAS signal, may provide for latching the valid write CAS address in an address latch as preparation for subsequently receiving an external read CAS signal to indicate a valid read CAS address. Embodiments of the DRAM modules of system memory 115 may also include data buffers to buffer the set of write data values to be stored in DRAM locations corresponding to the write CAS address.

According to some embodiments of shadow writes herein disclosed, control logic 116 and/or shadow control logic 118 of memory controller 110, are also responsive to receiving processor read requests prior to the completion of write requests, and issue external read CAS signals to DRAM modules of system memory 115 to indicate a valid read CAS address, after asserting the external write CAS but prior to the complete set of write data values being asserted by memory controller 110.

In response to receiving the external read CAS signal, shadow write control logic 117 in DRAM modules of system memory 115 may issue an internal read CAS signal, concurrent with buffering of the set of write data values. An internal write CAS signal may be issued after the internal read CAS signal and after buffering of the set of write data values is complete. Using a read CAS address supplied at the time of the external read CAS signal, column decoders read a set of read data values from a second set of DRAM locations, but after the internal write CAS signal has been issued. These read data values are buffered for transmission to memory controller 110.

Memory controller 110 then receives the set of read data values from DRAM locations of system memory 115 corresponding to the read CAS address, after the complete set of write data values has been asserted. Therefore through use of shadow writes, the duration of the turnaround time period that memory controller 110 must wait for a read data transfer may be significantly reduced, improving performance-sensitive read operations from DRAM modules of system memory 115.

Figure 2:
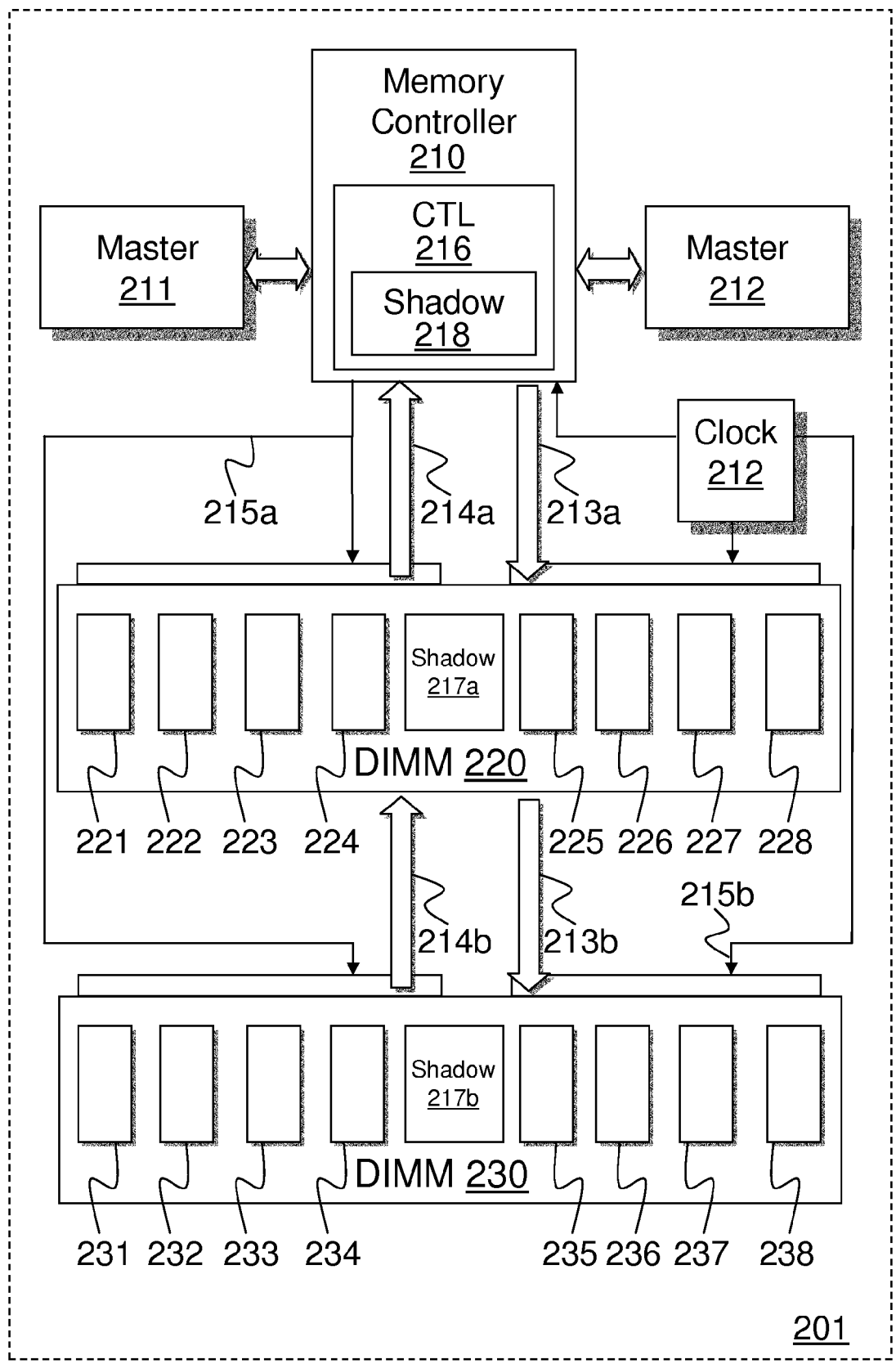
FIG. 2 illustrates an alternative embodiment of a computing system using shadow writes in a memory controller and in DRAM.

FIG. 2 illustrates an alternative embodiment of a computing system 201 using shadow writes in a memory controller 210 and in DRAM. Computing system 201 includes dual in-line memory module (DIMM) 220 and DIMM 230, bus masters 211 and 212, and memory controller 210. Bus masters, 211 and 212, issue write requests and read requests corresponding to storage locations in DIMM 220 and/or DIMM 230.

Memory controller 210 includes control logic 216 for accessing DIMM 220 and/or DIMM 230. Control logic 216 includes standard DRAM control logic and also includes shadow control logic 218. Control logic 216 and/or shadow control logic 218 of memory controller 210, are responsive to receiving write requests and issue external write CAS signals to DIMM 220 and/or DIMM 230 to latch valid write CAS addresses for accessing the DRAM of DIMM 220 and/or DIMM 230. Memory controller 210 asserts a set of write data values to be stored in DRAM locations of DIMM 220 or of DIMM 230 corresponding to the write CAS address.

As above, some embodiments of DIMM 220 and DIMM 230 may include DDR DRAM modules and the set of write data values may be double pumped. Embodiments of DIMM 220 and DIMM 230 may also include DRAM locations that may be organized into banks of DRAM locations, and the banks may be organized into bank groups. Shadow write control logic 217a and 217b in DIMM 220 and DIMM 230, upon receiving the external write CAS signal, may provide for latching the valid write CAS address in an address latch as preparation for subsequently receiving an external read CAS signal to indicate a valid read CAS address. Embodiments of DIMM 220 and DIMM 230 may also include data buffers to buffer the set of write data values to be stored in DRAM locations corresponding to the write CAS address.

According to some embodiments of shadow writes, control logic 216 and/or shadow control logic 218 of memory controller 210, are also responsive to receiving read requests and issue external read CAS signals to DIMM 220 and/or DIMM 230 to indicate a valid read CAS address, after asserting the external write CAS but prior to the complete set of write data values being asserted by memory controller 210.

In response to receiving the external read CAS signal, shadow write control logic 217a or 217b in DIMM 220 or DIMM 230 may issue an internal read CAS signal, concurrent with buffering of the set of write data values. An internal write CAS signal may be issued after the internal read CAS signal, and after buffering of the set of write data values is complete. Using a read CAS address supplied at the time of the external read CAS signal, column decoders read a set of read data values from a second set of DRAM locations, but after the internal write CAS signal has been issued. These read data values are buffered for transmission to memory controller 210.

Memory controller 210 then receives the set of read data values from DRAM locations of DIMM 220 and/or DIMM 230 corresponding to the read CAS address, after the complete set of write data values has been asserted.

Through use of the methods and apparatus herein disclosed, the duration of the turnaround time period that the memory controller 210 must wait for a read data transfer from DRAM locations of DIMM 220 and/or DIMM 230 are reduced, which may be critical to overall performance of system 201.

Figure 3:
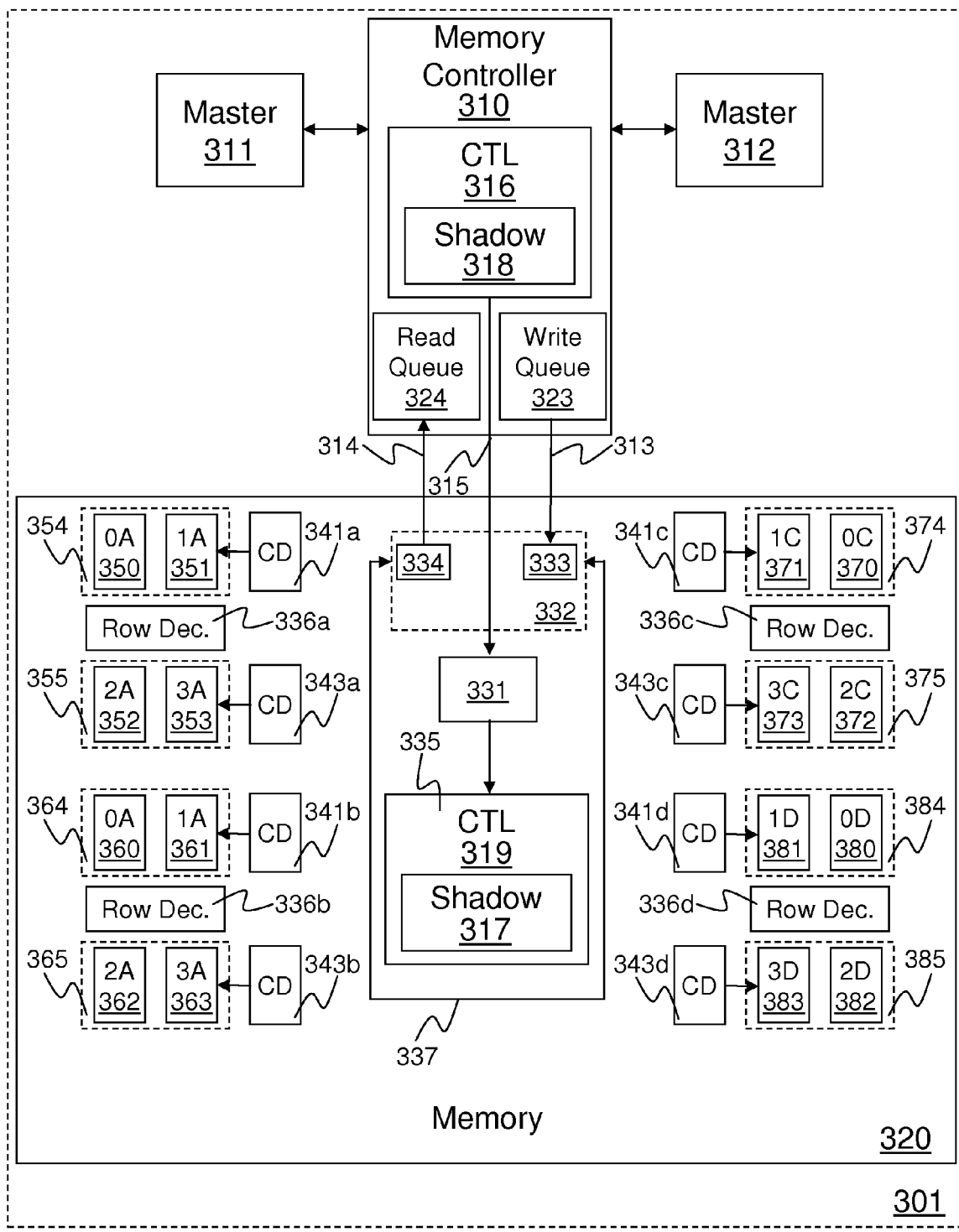
FIG. 3 illustrates another alternative embodiment of a computing system using shadow writes in a memory controller and in DRAM.

FIG. 3 illustrates another alternative embodiment of a computing system 301 using shadow writes in a memory controller 310 and in DRAM. Computing system 301 includes memory 320, bus masters 311 and 312, and memory controller 310. Bus masters, 311 and 312, can issue write requests and read requests corresponding to storage locations in memory 320.

Memory controller 310 includes read queue 324, write queue 323, and control logic 316 for accessing memory 320. Control logic 316 includes standard DRAM control logic and also includes shadow control logic 318. Control logic 316 and/or shadow control logic 318 of memory controller 310, are responsive to receiving write requests, and issue external write CAS signals to memory 320 to latch valid write CAS addresses for accessing the DRAM locations of memory 320. Memory controller 310 asserts a set of write data values to be stored in DRAM locations of memory 320 corresponding to the write CAS address.

Some embodiments of memory 320 may be comprised of DDR DRAM and so the set of write data values may be double pumped from write queue 323 via interface 313. Embodiments of memory 320 also include DRAM locations that may be organized into banks 350-353, 360-363, 370-373 and 380-383 of DRAM locations, and the banks may be organized into bank groups 354 & 355, 364 & 365, 374 & 375 and 384 & 385.

Control logic 319 and/or shadow write control logic 317 in memory 320, upon receiving the external write CAS signal via interface 315, may provide for latching the valid write CAS address in an address latch 331 as preparation for subsequently receiving an external read CAS signal via interface 315 to indicate a valid read CAS address. Embodiments of memory 320 may also include data buffers 333 to buffer the set of write data values to be stored in DRAM locations corresponding to the write CAS address.

According to some embodiments of shadow writes, control logic 316 and/or shadow control logic 318 of memory controller 310, are also responsive to receiving read requests prior to the completion of write requests, and may issue external read CAS signals via interface 315 to memory 320 to indicate a valid read CAS address, the external read CAS signals being issued after asserting the external write CAS via interface 315, but prior to the complete set of write data values being asserted via interface 313. In some embodiments of control logic 316 and/or shadow control logic 318 of memory controller 310, external read CAS signals are issued to memory 320 for a read CAS address only when there is no conflict with regard to bank groups 354 & 355, 364 & 365, 374 & 375 and 384 & 385 and the latched write CAS address (i.e. decoders should not potentially access the same locations).

In response to receiving the external read CAS signal via interface 315, Control logic 319 and/or shadow write control logic 317 in memory 320 may issue an internal read CAS signal, concurrent with buffering of the set of write data values in data buffers 333. An internal write CAS signal may be issued after the internal read CAS signal and after buffering of the set of write data values in data buffers 333 is complete. The set of write data values in data buffers 333 may then be provided via internal data bus 337 to be stored in DRAM locations corresponding to the write CAS address in address latch 331. Using a read CAS address supplied at the time of the external read CAS signal, column decoders 341a & 343a, 341b & 343b, 341c & 343c and/or 341d & 343d read a set of read data values onto internal data bus 337 from a second set of DRAM locations, but after the internal write CAS signal has been issued. These read data values are buffered in data buffers 334 for transmission via interface 314 to memory controller 310. In some embodiments data buffers 333 and data buffers 334 comprise a single set of data buffers 332, and interfaces 313 and 314 comprise a single bi-directional interface for buffering and for transmitting both write data values and read data values.

Memory controller 310 then receives the set of read data values from DRAM locations of memory 320 corresponding to the read CAS address, after the complete set of write data values has been asserted. Therefore through use of shadow writes, the duration of the turnaround time period that memory controller 310 must wait for a read data transfer may be significantly reduced, improving performance-sensitive read operations from memory 320.

Figure 4:
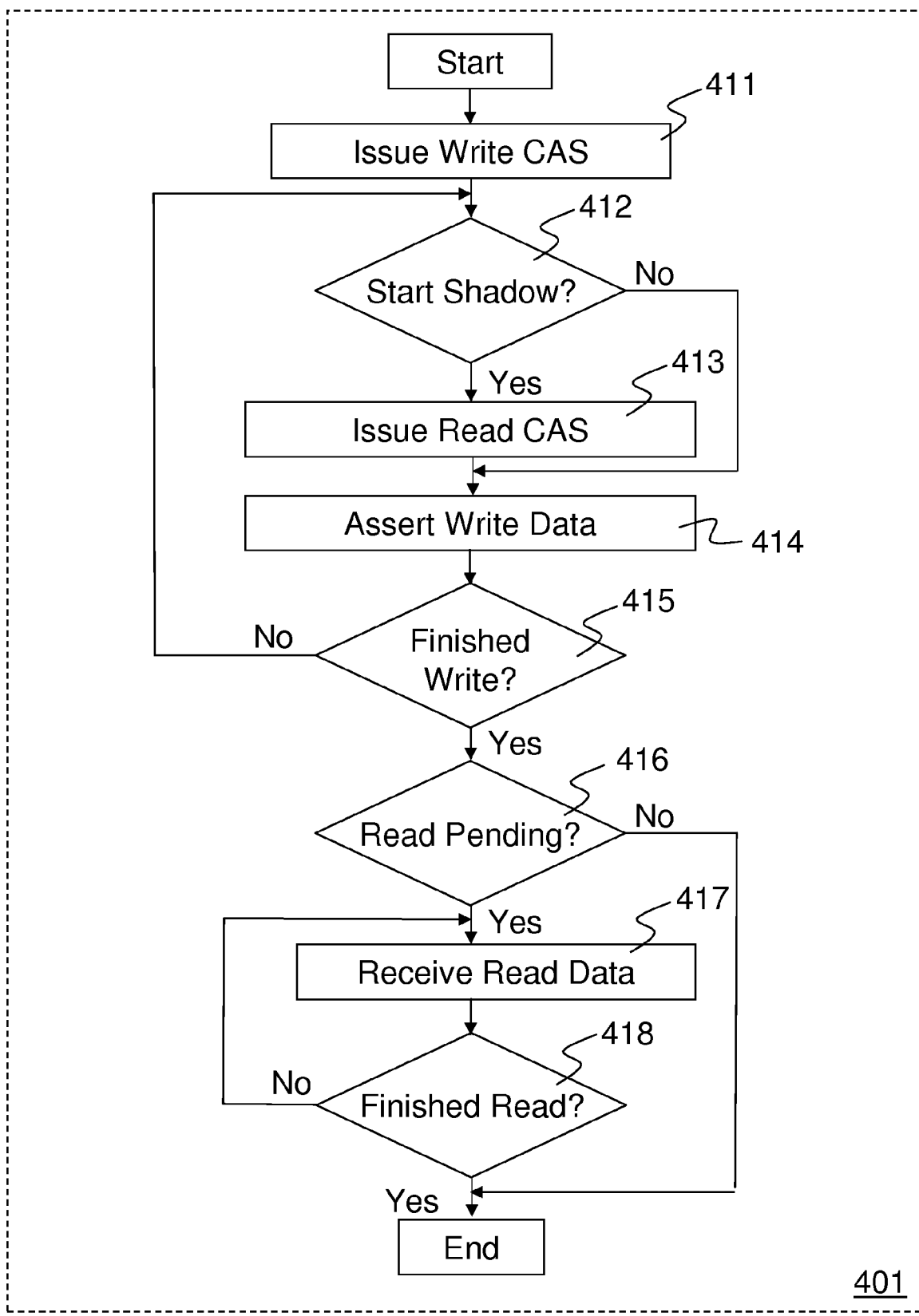
FIG. 4 illustrates a flow diagram for one embodiment of a process to use shadow writes in a memory controller.

FIG. 4 illustrates a flow diagram for one embodiment of a process 401 to use shadow writes in a memory controller. Process 401 and other processes herein disclosed are performed by processing blocks that may comprise dedicated hardware or software or firmware operation codes executable by general purpose machines or by special purpose machines or by a combination of both.

In processing block 411 a write CAS is issued to the DRAM to latch a valid write CAS address for accessing the DRAM. In processing block 412, it is determined whether to start a shadow write and if so, processing proceeds to processing block 413 where a read CAS is issued to the DRAM to indicate a valid read CAS address, after asserting the write CAS but prior to and/or concurrent with asserting a complete set of write data values. Otherwise, following the determination of processing block 412, processing proceeds directly to processing block 414. In either event, a set of write data values to be stored in DRAM locations corresponding to the write CAS address are asserted in processing block 414.

In processing block 415, it is determined whether the current write is the last write to be performed (because no more writes are needed or because a read is required) and if not, processing repeats in processing block 412. Otherwise, processing proceeds to processing block 416 where it is determined whether a read is pending because of a shadow write, and if not, processing terminates from processing block 416. On the other hand if a read is pending because of a shadow write, then processing proceeds to processing block 417 where a set of read data values is received from DRAM locations corresponding to the read CAS address, but after asserting the complete set of write data values. In processing block 418, it is determined whether the current read is the last read to be performed (because no more reads are needed) and if so processing terminates from processing block 418. Otherwise processing repeats in processing block 417.

It will be appreciated that process 401 may be used in a memory controller (e.g. memory controllers 110, 210 and/or 310) and in cooperation with shadow-write support in system memory to reduce turnaround time periods that the memory controller must wait for a read data transfer (e.g. in systems 101, 201 and/or 301 respectively).

Figure 5:
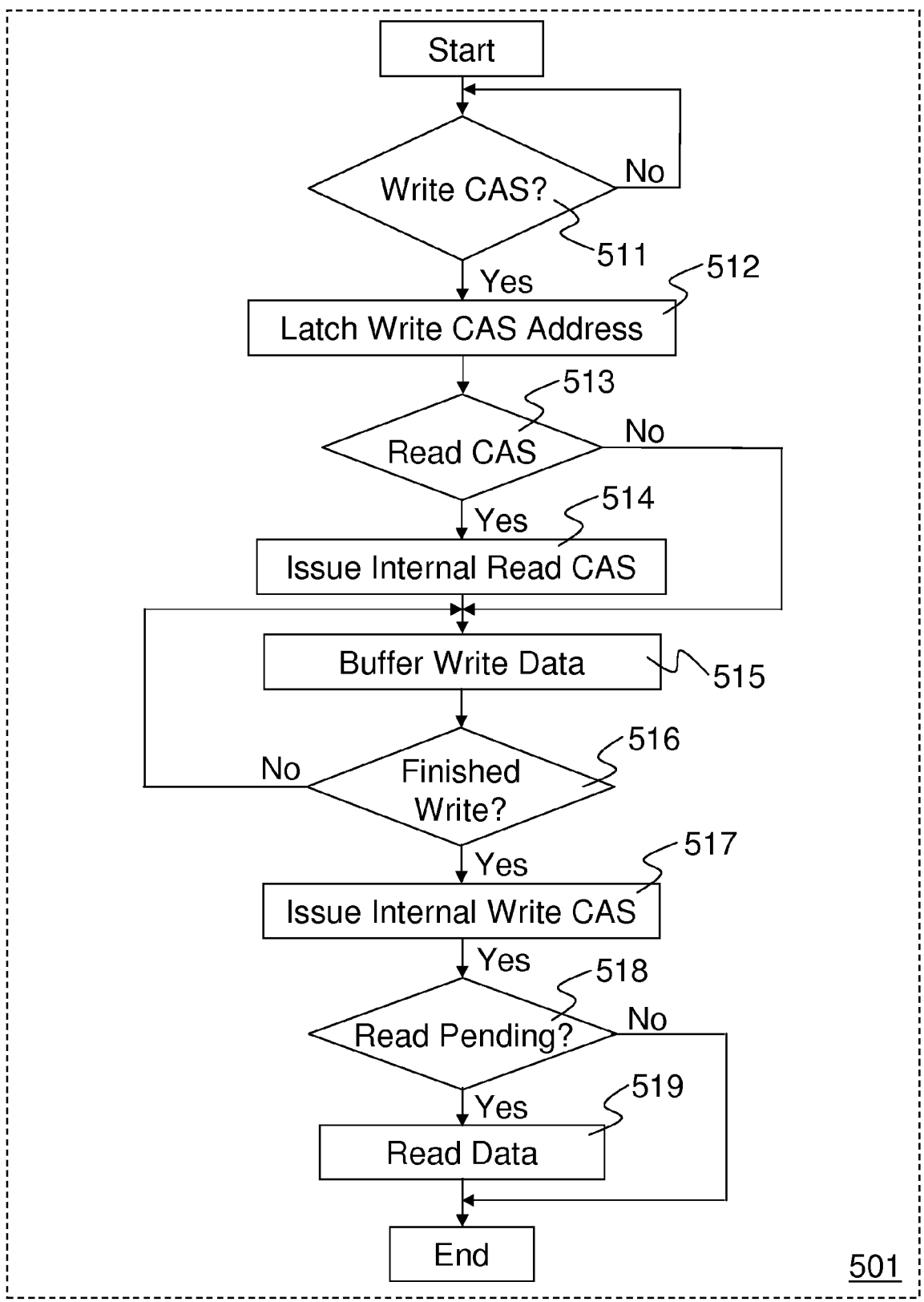
FIG. 5 illustrates a flow diagram for one embodiment of a process to use shadow writes in a DRAM.

FIG. 5 illustrates a flow diagram for one embodiment of a process 501 to use shadow writes in a DRAM. In processing block 511 process 501 waits to receive an external write CAS signal. When an external write CAS signal is received processing proceeds in processing block 512 where a valid write CAS address for accessing the DRAM is latched.

In processing block 513, it is determined whether an external write CAS signal has been received to indicate a valid read CAS address and if so, processing proceeds to processing block 514, where an internal read CAS signal is issued. Otherwise, following the determination of processing block 513, processing proceeds directly to processing block 515. In either event, a set of write data values to be stored in DRAM locations corresponding to the write CAS address are buffered in processing block 515.

In processing block 516, it is determined whether the current write is the last write to be performed (because no more writes are needed or because a read is required) and if not, processing repeats in processing block 515. Otherwise, processing proceeds to processing block 517 where an internal write CAS signal is issued.

In processing block 518 it is determined whether a read is pending because of a shadow write, and if not, processing terminates from processing block 518. Otherwise a set of read data values is read from DRAM locations corresponding to the read CAS address in processing block 519 and processing for process 501 terminates from processing block 519.

It will be appreciated that process 501 may be used in a DRAM and in cooperation with shadow-write support in a memory controller (e.g. memory controllers 110, 210 and/or 310) to reduce turnaround time periods, which may be critical to performance of system (e.g. in systems 101, 201 and/or 301 respectively)

Figure 6A:
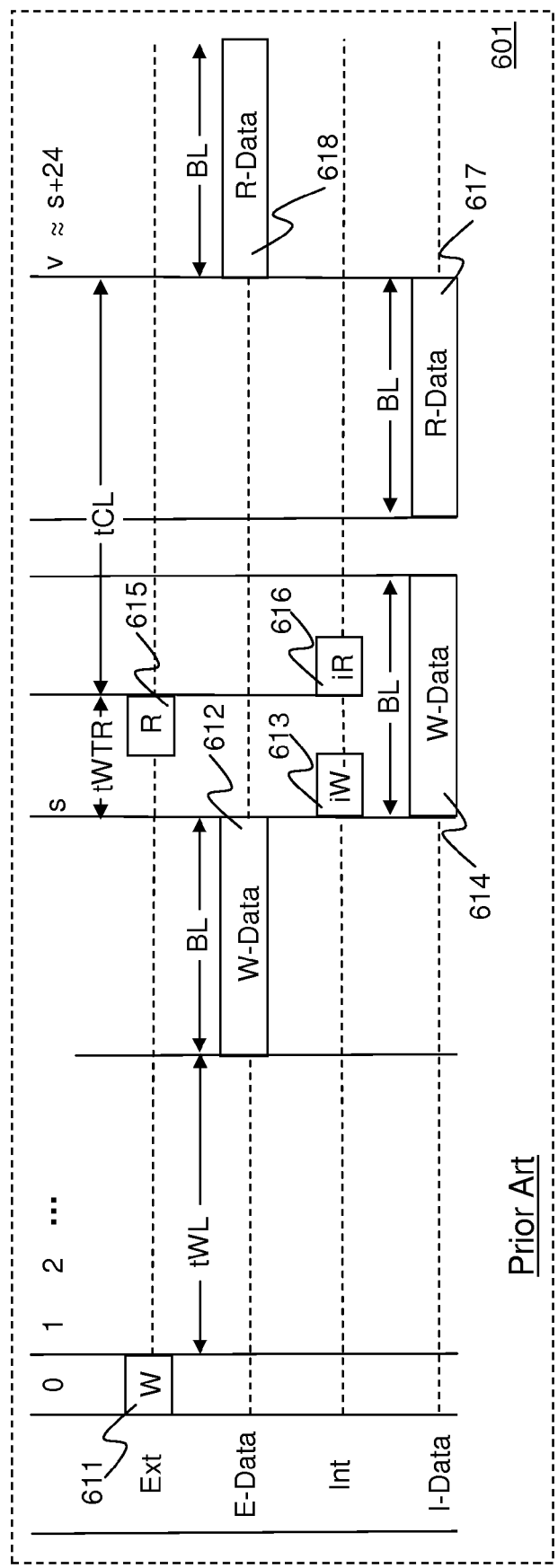
FIG. 6a illustrates a timing diagram for a process that does not use shadow writes in a memory controller and in DRAM.

FIG. 6a illustrates a timing diagram 601 for a prior art process that does not use shadow writes in a memory controller or in DRAM. The memory controller for timing diagram 601 includes standard DRAM control logic (but not shadow control logic). The DRAM control logic is responsive to receiving a processor write request and issues an external write CAS signal 611 to a DRAM module of system memory to latch a valid write CAS address. The memory controller then, after a write latency period, tWL, asserts a set of write data values 612 to be stored in DRAM locations of system memory corresponding to the write CAS address.

Responsive to receiving a processor read request prior to the completion of the write request, control logic of the memory controller can not issue an external read CAS signal 615 to DRAM modules of system memory to indicate a valid read CAS address until a write-to-read period, tWTR, after the complete set of write data values 612 has been asserted by the memory controller to avoid internal conflicts between write data and read data.

An internal write CAS signal 613 may be issued after buffering of the set of write data values 612 is complete (shown as a time s) and the set of write data values 614 may be asserted internally for storage to DRAM locations corresponding to the write CAS address.

Following the period, tWTR, after the complete set of write data values 612 is asserted, the memory controller issues an external read CAS signal 615 to the DRAM module to indicate a valid read CAS address. In response to receiving the external read CAS signal 615, control logic in the DRAM module may issue an internal read CAS signal 616. Using the read CAS address supplied at the time of the external read CAS signal 615, column decoders read a set of read data values 617 from a second set of DRAM locations, in response to the internal read CAS signal 616, but not concurrent with the set of write data values 614 being asserted internally. These read data values 617, over a column latency period, tCL, are buffered for transmission to the memory controller.

The memory controller then (shown as a time v) receives the set of read data values 618 from DRAM locations of system memory corresponding to the read CAS address, following a total turnaround period tWTR+tCL after the complete set of write data values 612 has been asserted (e.g. such turnaround periods for forecasted technologies may be 20-30 external clock cycles or more).

Figure 6B:
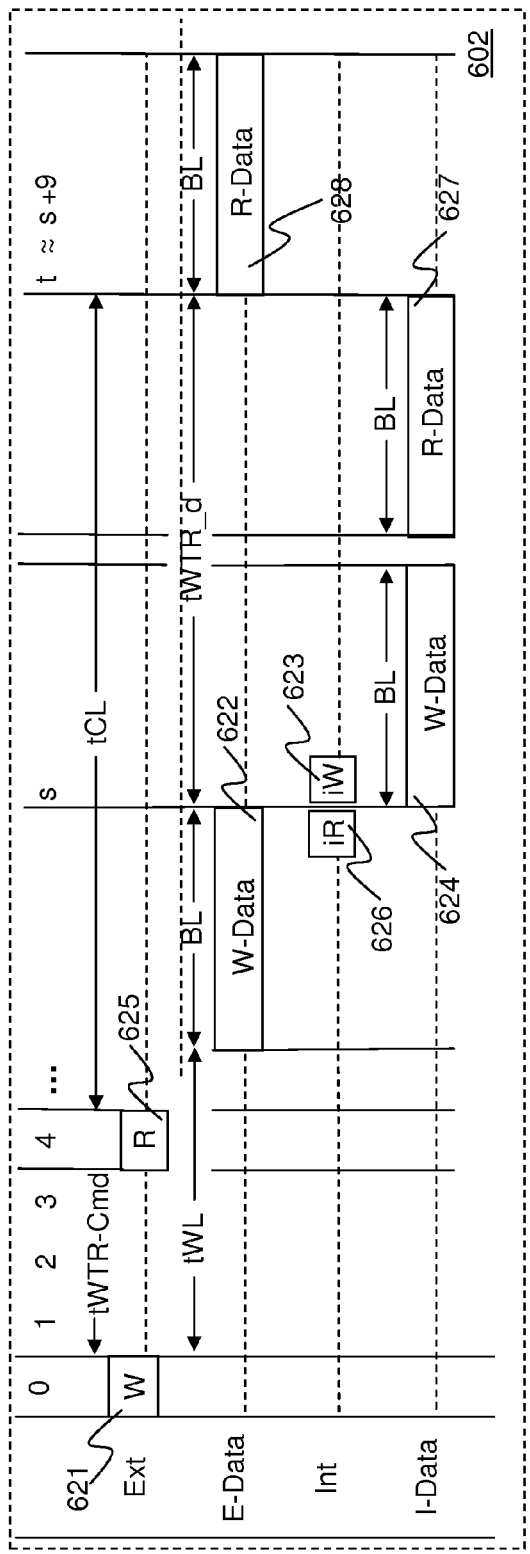
FIG. 6b illustrates a timing diagram for one embodiment of a process using shadow writes in a memory controller and in DRAM.

FIG. 6b illustrates a timing diagram 602 for one embodiment of a process using shadow writes in a memory controller and in DRAM. The memory controller includes standard DRAM control logic and also includes shadow control logic that is responsive to receiving a processor write request and issues an external write CAS signal 621 to a DRAM module of system memory to latch a valid write CAS address. The memory controller then asserts a set of write data values 622 to be stored in DRAM locations of system memory corresponding to the write CAS address.

System memory may comprise DDR4 (or higher) DRAM modules and the asserted set of write data values 622 may comprise eight bytes of data that are double pumped in four external clock cycles. Shadow write control logic in DRAM modules of system memory, upon receiving the external write CAS signal, may provide for latching the valid write CAS address as preparation for subsequently receiving an external read CAS signal 625 to indicate a valid read CAS address prior to completion of the write data values being asserted 622 by the memory controller. The DRAM modules of system memory may also include data buffers to buffer the set of write data values to be stored in DRAM locations corresponding to the write CAS address.

Responsive to receiving a processor read request early, i.e. prior to the completion of the write request or even prior to asserting the set of write data values 622, control logic and/or shadow control logic of the memory controller may issue an external read CAS signal 625 to DRAM modules of system memory to indicate a valid read CAS address. The external read CAS 625 of this embodiment may be issued a specified time period, tWTR_cmd, after the external write CAS 621 but prior to the set of write data values 622 being asserted by the memory controller. In some embodiments the minimum time period, tWTR_cmd, may be as little as only a few external clock cycles (e.g. 3). The DRAM modules of system memory may be organized into banks of DRAM locations, the banks optionally being further organized into bank groups. In some embodiments of the memory controller, control logic and/or shadow control logic issue an external read CAS signal 625 to a DRAM module of system memory for a read CAS address only when there is no conflict with regard to the bank groups and a previously latched write CAS address.

In response to receiving the external read CAS signal 625, shadow write control logic in a DRAM module of system memory may issue an internal read CAS signal 626. The internal read CAS signal may be issued concurrent with buffering of the set of write data values 622. An internal write CAS signal 623 may then be issued, after the internal read CAS signal 626 and after buffering of the set of write data values 622 is complete (shown again as a time s), and the set of write data values 624 may be asserted internally for storage to DRAM locations corresponding to the write CAS address. Using a read CAS address supplied at the time of the external read CAS signal 625, column decoders read a set of read data values 627 from a second set of DRAM locations, in response to the internal read CAS signal 626 but concurrent with or after the internal write CAS signal 623 has been issued. These read data values 627 are buffered for transmission to the memory controller. It will be appreciated that in embodiments of DRAM modules where separate buffers are available for write data and for read data, an earlier internal read CAS signal 626 and buffering read data values 627 for transmission could both precede the internal write CAS signal 623.

The memory controller then (shown as a time t) receives the set of read data values 628 from DRAM locations of system memory corresponding to the read CAS address, after the complete set of write data values 622 has been asserted. Therefore through use of shadow writes, the duration of the write-to-read turnaround time period may be significantly reduced (e.g. such turnaround periods may be less than half the external clock cycles required without shadow writes), improving performance-sensitive read operations from the DRAM modules of system memory.

Figure 6C:
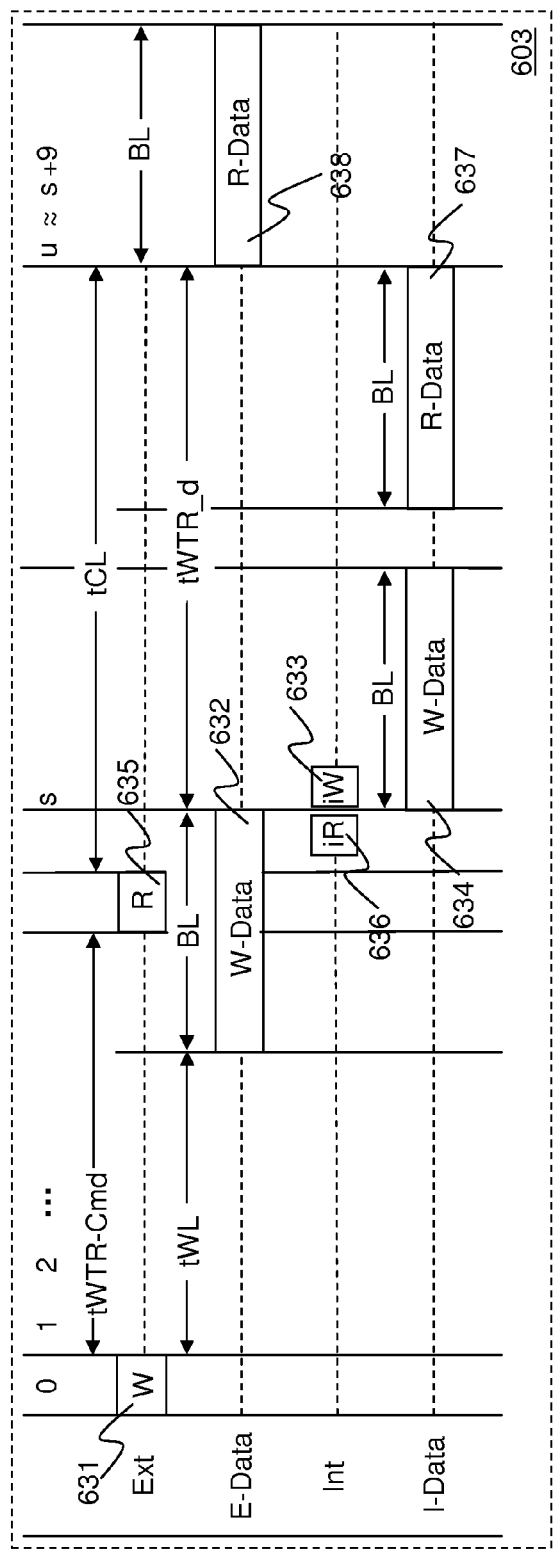
FIG. 6c illustrates a timing diagram for an alternative embodiment of a process using shadow writes in a memory controller and in DRAM.

FIG. 6c illustrates a timing diagram 603 for an alternative embodiment of a process using shadow writes in a memory controller and in DRAM. In similarity to timing diagram 602 the memory controller is responsive to receiving a processor write request and issue an external write CAS signal 631 to a DRAM module to latch a valid write CAS address. The memory controller then begins asserting a set of write data values 632 to be stored in DRAM locations corresponding to the write CAS address.

Shadow write control logic in the DRAM module, receives the external write CAS signal 631 and may latch the valid write CAS address as preparation for the possibility of an early external read CAS signal 635 prior to completion of the write data values 632 being asserted. The DRAM module may also buffer the set of write data values 632 to be stored in DRAM locations corresponding to the write CAS address.

Responsive to receiving a processor read request, even late in the processing of a write request but prior to the completion of the write request, control logic and/or shadow control logic of the memory controller issue an external read CAS signal 635 to DRAM module to indicate a valid read CAS address. The external read CAS 635, in this alternative embodiment, may be issued even after the write data values 632 are being asserted/buffered, but no later than the last clock cycle when the write data values 632 are being asserted/buffered. This corresponds to a maximum time period for tWTR_cmd, in which control logic and/or shadow control logic of the memory controller may issue an external read CAS signal 635 to the DRAM module to initiate a shadow write. In some embodiments the maximum time period, tWTR_cmd, may be comparable to the write latency, tWL, plus the data burst length, BL, in external clock cycles minus one (e.g. 11).

Again if DRAM modules of system memory are organized into banks of DRAM locations, and further organized into bank groups, in some embodiments an external read CAS signal 635 may be issued for a read CAS address only when there is no conflict with regard to the bank groups and a previously latched write CAS address.

In response to receiving the external read CAS signal 635, shadow write control logic in the DRAM module may issue an internal read CAS signal 636. The internal read CAS signal may be issued concurrent with buffering of the set of write data values 632. An internal write CAS signal 633 may then be issued, after the internal read CAS signal 636 and after buffering of the set of write data values 632 is complete (shown again as a time s), and the set of write data values 634 may be asserted internally for storage to DRAM locations corresponding to the write CAS address. Using a read CAS address supplied at the time of the external read CAS signal 635, column decoders read a set of read data values 637 from a second set of DRAM locations, in response to the internal read CAS signal 636 but concurrent with or after the internal write CAS signal 633 has been issued. These read data values 637 are again buffered for transmission to the memory controller.

The memory controller then (shown as a time u) receives the set of read data values 638 from DRAM locations corresponding to the read CAS address after the complete set of write data values 632 has been asserted. Again therefore, through use of shadow writes, the duration of the write-to-read turnaround time period may be significantly reduced, improving performance-sensitive read operations from the DRAM modules of system memory.

The above description is intended to illustrate preferred embodiments of the present invention. From the discussion above it should also be apparent that especially in such an area of technology, where growth is fast and further advancements are not easily foreseen, the invention can may be modified in arrangement and detail by those skilled in the art without departing from the principles of the present invention within the scope of the accompanying claims and their equivalents.

What is claimed is:

1. A method for improved access to a Dynamic Random Access Memory (DRAM), the method comprising:
   issuing a write Column Address Strobe (CAS) address to the DRAM to latch a valid write CAS address for accessing the DRAM;
   asserting a set of write data values to be stored in a first set of DRAM locations corresponding to the write CAS address;
   issuing a read CAS address to the DRAM to indicate a valid read CAS address, after asserting the write CAS address and prior to asserting the set of write data values; and
   receiving a set of read data values from a second set of DRAM locations corresponding to the read CAS address, after asserting the set of write data values; and
   wherein issuing the read CAS address to the DRAM occurs at least 4 clock cycles after receiving an external write CAS signal corresponding to the write CAS address and occurs no later than a particular clock cycle when a last write data value of the set of write data values to be stored is buffered.

2. The method of claim 1 wherein said first set of DRAM locations corresponding to the write CAS address, and said second set of DRAM locations corresponding to the read CAS address are in different bank groups.

3. The method of claim 2 wherein issuing the read CAS address to the DRAM occurs at least 3 clock cycles after issuing the write CAS address and occurs at least 1 clock cycle prior to asserting a last write data value of the set of write data values.

4. A method for improved access to a Dynamic Random Access Memory (DRAM), the method comprising:
   latching a valid write Column Address Strobe (CAS) address for accessing the DRAM in response to receiving an external write CAS signal;
   buffering a set of write data values to be stored in a first set of DRAM locations corresponding to the write CAS address;
   issuing an internal read CAS signal in response to receiving an external read CAS signal to indicate a valid read CAS address, and concurrent with buffering the set of write data values;
   issuing an internal write CAS signal after issuing the internal read CAS signal and after buffering the set of write data values;
   reading a set of read data values from a second set of DRAM locations corresponding to the read CAS address, after issuing the internal write CAS signal;
   wherein said first set of DRAM locations corresponding to the write CAS address, and said second set of DRAM locations corresponding to the read CAS address are in different bank groups; and
   wherein issuing the internal read CAS signal to the DRAM occurs at least 4 clock cycles after receiving the external write CAS signal and occurs no later than a particular clock cycle when a last write data value of the set of write data values is being buffered.

5. A memory controller comprising:
- a shadow control logic configured to issue a write Column Address Strobe (CAS) address to a Dynamic Random Access Memory (DRAM) to latch a valid write CAS address for accessing the DRAM;
- a write queue configured to assert a set of write data values to be stored in a first set of DRAM locations corresponding to the write CAS address;
- said shadow control logic configured to issue a read CAS address to the DRAM to indicate a valid read CAS address, after asserting the write CAS address and prior to said asserting of the set of write data values is complete; and
- a read queue configured to receive a set of read data values from a second set of DRAM locations corresponding to the read CAS address, after asserting the set of write data values; and
- wherein issuing the read CAS address to the DRAM occurs at least 4 clock cycles after receiving an external write CAS signal corresponding to the write CAS address and occurs no later than a particular clock cycle when a last write data value of the set of write data values to be stored is queued by the write queue.

6. The memory controller of claim 5 wherein said first set of DRAM locations corresponding to the write CAS address, and said second set of DRAM locations corresponding to the read CAS address are in different bank groups.

7. The memory controller of claim 6 wherein issuing the read CAS address to the DRAM occurs at least 3 clock cycles after issuing the write CAS address and occurs at least 1 clock cycle prior to asserting a last write data value of the set of write data values.

8. The memory controller of claim 6 wherein said asserting of the set of write data values to be stored in a first set of DRAM locations, is double pumped by the write queue.

9. A Dynamic Random Access Memory (DRAM) module comprising:
- a plurality of DRAM locations configured to store data, said plurality of DRAM locations being organized into banks of DRAM locations and the banks of DRAM locations being further organized into bank groups;
- a shadow control logic configured to receive an external write Column Address Strobe (CAS) signal to indicate a valid write CAS address and to subsequently receive an external read CAS signal to indicate a valid read CAS address;
- an address latch responsive to the shadow control logic, after receiving the external write CAS signal, configured to latch the valid write CAS address for accessing the DRAM module;
- a data buffer, responsive to the shadow control logic, configured to buffer a set of write data values to be stored in a first set of DRAM locations corresponding to the write CAS address;
- said shadow control logic to issue an internal read CAS signal in response to receiving the external read CAS signal, and concurrent with said buffering of the set of write data values, and to issue an internal write CAS signal after issuing the internal read CAS signal and after the buffering of the set of write data values is complete;
- a column decoder configured to decode the read CAS address to read a set of read data values from a second set of DRAM locations, after issuing the internal write CAS signal; and
- wherein issuing the internal read CAS signal to the DRAM module occurs at least 4 clock cycles after receiving the external write CAS signal and occurs no later than a particular clock cycle when a last write data value of the set of write data values is being buffered.

10. The DRAM module of claim 9 wherein said first set of DRAM locations corresponding to the write CAS address, and said second set of DRAM locations corresponding to the read CAS address are in different bank groups.

11. The DRAM module of claim 9 wherein the module is a double-data-rate four (DDR4) DRAM module.

12. A computing system comprising:
- an addressable memory including a Dynamic Random Access Memory (DRAM) module;
- a processor operatively coupled with the addressable memory to issue write requests and read requests corresponding to storage locations in the addressable memory;
- a memory controller coupled with the addressable memory and including a first shadow control logic, the first shadow control logic being responsive to receiving a processor write request to the addressable memory configured to:
  - issue an external write Column Address Strobe (CAS) address to the DRAM module to latch a valid write CAS address for accessing the DRAM module,
  - assert a set of write data values to be stored in a first set of DRAM locations corresponding to the external write CAS address;
- the first shadow control logic of said memory controller further being responsive to receiving a processor read request from the addressable memory to:
  - issue an external read CAS address to the DRAM module to indicate a valid read CAS address, after asserting the external write CAS address and prior to asserting the set of write data values,
  - receiving a set of read data values from a second set of DRAM locations corresponding to the external read CAS address, after asserting the set of write data values; and
- wherein issuing the internal read CAS signal occurs at least 4 clock cycles after the external write CAS signal and occurs no later than a particular clock cycle when a last write data value of the set of write data values is being buffered.

13. The system of claim 12, the DRAM module including a second shadow control logic, the second shadow control logic to:
- buffer the set of write data values to be stored in the first set of DRAM locations corresponding to the valid write CAS address previously latched;
- issue an internal read CAS signal in response to receiving the external read CAS signal to indicate a valid read CAS address, and concurrent with buffering the set of write data values;
- issue an internal write CAS signal after issuing the internal read CAS signal and after buffering the set of write data values; and
- reading a set of read data values from a second set of DRAM locations corresponding to the external read CAS address, after issuing the internal write CAS signal.

14. The system of claim 13 wherein the first set of DRAM locations corresponding to the external write CAS address and the second set of DRAM locations corresponding to the external read CAS address are in different bank groups.

15. The system of claim 12 wherein the DRAM module is a double-data-rate four (DDR4) DRAM module.

16. The system of claim 15 wherein issuing the external read CAS address to the DRAM module occurs at least 3 clock cycles after issuing the external write CAS address and occurs at least 1 clock cycle prior to asserting a last write data value of the set of write data values.

* * * * *